US011438529B1

(12) United States Patent
Jew et al.

(10) Patent No.: US 11,438,529 B1
(45) Date of Patent: Sep. 6, 2022

(54) DETECTOR, IMAGING SYSTEM AND METHOD FOR DETECTING UNCOOLED THERMAL SYSTEMS

(71) Applicant: BAE Systems Information and Electronic Systems Integration Inc., Nashua, NH (US)

(72) Inventors: Jeffrey L. Jew, Brookline, NH (US); Michael A. Costolo, Amherst, NH (US); Adam O. Powers, Manchester, NH (US)

(73) Assignee: BAE Systems Information and Electronic System Integration Inc., Nashua, NH (US)

( * ) Notice: Subject to any disclaimer, the term of this patent is extended or adjusted under 35 U.S.C. 154(b) by 166 days.

(21) Appl. No.: 16/987,879

(22) Filed: Aug. 7, 2020

(51) Int. Cl.
*H04N 5/33* (2006.01)
*H01L 27/146* (2006.01)

(52) U.S. Cl.
CPC ......... *H04N 5/33* (2013.01); *H01L 27/14649* (2013.01)

(58) Field of Classification Search
CPC .................... H04N 5/33; H01L 27/14649
See application file for complete search history.

(56) References Cited

U.S. PATENT DOCUMENTS

| 7,154,599 | B2 * | 12/2006 | Adams | ................ | G01J 3/4406 |
| | | | | | 356/326 |
| 2012/0169053 | A1 * | 7/2012 | Tchoryk, Jr. | ............ | G01S 7/491 |
| | | | | | 356/28 |
| 2012/0235042 | A1 * | 9/2012 | Cole | ..................... | G01J 5/0018 |
| | | | | | 250/353 |

FOREIGN PATENT DOCUMENTS

| JP | 3646164 B2 * | 5/2005 | ............. G01N 21/64 |
| KR | 101392721 B1 * | 8/2014 | ............... H04N 5/33 |

OTHER PUBLICATIONS

Boston Electronics, Ultraviolet Photodiodes—SIC, published by at least May 24, 2020—see WayBack Machine Capture, available at http://www.boselec.com/product-category/ultraviolet-photodiodes-sic (Year: 2020).*

(Continued)

*Primary Examiner* — David P Porta
*Assistant Examiner* — Jeremy S Valentiner
(74) *Attorney, Agent, or Firm* — Scully Scott Murphy & Presser PC; Gary McFaline

(57) ABSTRACT

Systems for detecting a presence of a microbolometer are provided. The systems may also discriminate a type of the microbolometer. The systems may comprise analog filtering and processing or digital filtering and processing. In some examples, both analog and digital filtering may be used. For example, a system may comprises a photodiode, an analog to digital converter (ADC) having a frequency sampling rate of at least two times an expected frequency range of known microbolometers and a processor. The ADC may receive an amplified output from the photodiode and produce a sampled sequence using the frequency sampling rate. The processor converts the sampled sequence into a frequency profile, examines the frequency profile to identity at least a fundamental frequency and determines whether a microbolometer is detected in a line of sight of the photodiode based on the fundamental frequency.

29 Claims, 18 Drawing Sheets

(56) References Cited

OTHER PUBLICATIONS

Hamamatsu Photonics, Si Photodiodes: UV to near IR radiation, Selection Guide, Apr. 2020, available at https://www.hamamatsu.com/content/dam/hamamatsu-photonics/sites/documents/99_SALES_LIBRARY/ssd/si_pd_kspd0001e.pdf (Year: 2020).*

* cited by examiner

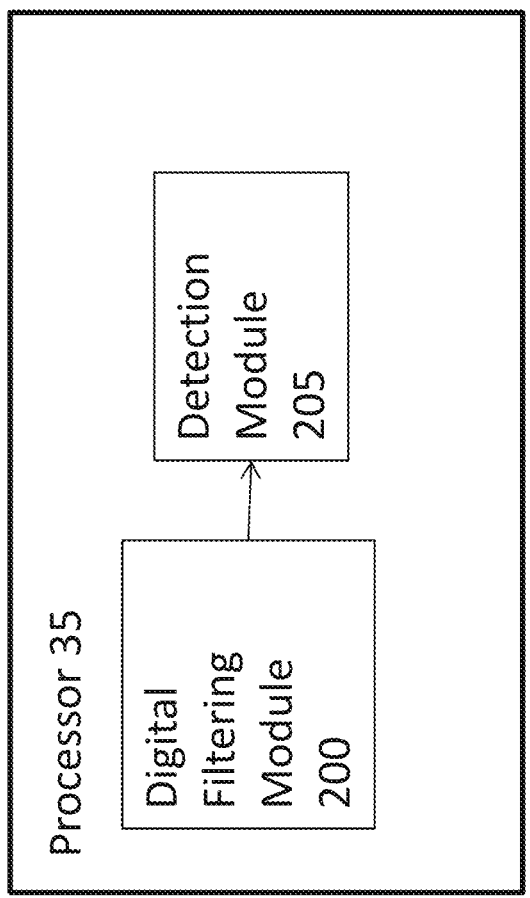
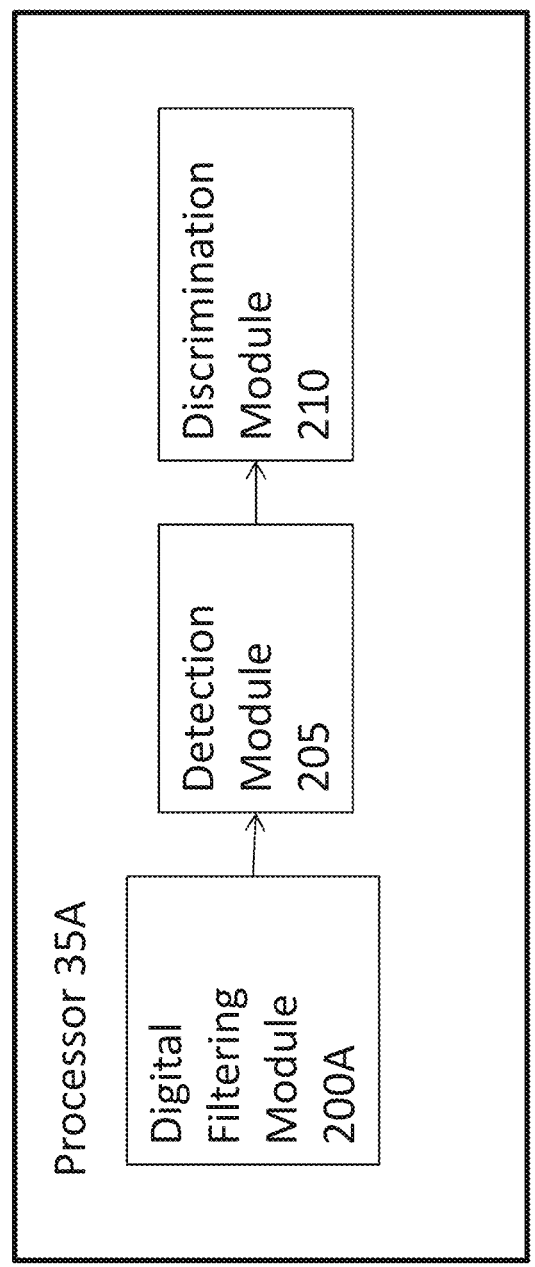

| Target | Fundamental Frequency |
|--------|----------------------|
| A | F1 |
| B | F2 |
| C | F3 |
| D | F4 |
| E | F5 |
| n | Fn |

| Target | Fundamental Frequency | 0:0 | 1:0 | 2:0 | 3:0 | n:0 |
|---|---|---|---|---|---|---|
| A | F1 | 1.0 | F1/Fh1 | F1/Fh2 | F1/Fh3 | F1/Fhn |
| B | F2 | 1.0 | F2/Fh1 | F2/Fh2 | F2/Fh3 | F2/Fhn |
| C | F3 | 1.0 | F3/Fh1 | F3/Fh2 | F3/Fh3 | F3/Fhn |
| D | F4 | 1.0 | F4/Fh1 | F4/Fh2 | F4/Fh3 | F4/Fhn |
| E | F5 | 1.0 | F5/Fh1 | F5/Fh2 | F5/Fh3 | F5/Fhn |
| n | Fn | 1.0 | Fn/Fh1 | Fn/Fh2 | Fn/Fh3 | Fn/Fhn |

| Target | 0:0 | 1:0 | 2:0 | 3:0 | 4:0 |
|---|---|---|---|---|---|
| A | 1.0 | 0.7095 | 0.4283 | 0.3268 | 0.2660 |
| B | 1.0 | 0.3656 | 0.2804 | 0.1540 | 0.1304 |
| D | 1.0 | 0.9219 | 0.8979 | 0.4027 | 0.3869 |
| E | 1.0 | 0.8645 | 0.7272 | 0.3819 | 0.4220 |
| G | 1.0 | 0.7049 | 0.3372 | 0.3851 | 0.2087 |
| H | 1.0 | 0.6092 | 0.4528 | 0.3527 | 0.2888 |

Fig. 8

DETECTOR, IMAGING SYSTEM AND METHOD FOR DETECTING UNCOOLED THERMAL SYSTEMS

FIELD OF THE DISCLOSURE

This disclosure relates to passive detection of uncooled microbolometers. This disclosure also relates to long wave infrared imaging systems.

BACKGROUND

Typical uncooled imagers are constructed from an array of microbolometers. An optical system focuses incident light in an image on the array. The microbolometers are designed to be highly absorptive in the spectral band of interest (typically the 8-12 μm long-wave IR band). As the microbolometers absorb the optical energy their temperature rises. This temperature is measured by the bolometric effect, wherein the resistance of the microbolometer is a function of its temperature. The most common bolometric material is vanadium oxide which has high bolometric coefficients (delta-R/delta-T) but a low device resistance. To compensate for this low resistance, microbolometer arrays use a "pulse bias" readout where the microbolometer is allowed to thermally equilibrate over several milliseconds and the resistance is read using a voltage or current pulse. System performance of these pulse biased microbolometers is optimized through efficient and well-focused optics, highly absorptive material, and thermally-isolated detectors.

SUMMARY

Disclosed are systems that detect microbolometers, such as uncooled microbolometers that are using the "pulse bias" readout. The "pulse bias" readout also causes a microbolometer to heat through joule heating effect. The energy deposited is sufficient to heat the detector elements several degrees centigrade. Due to optical reciprocity, the spectral emission of the detectors is equal to the spectral absorption and detectors radiate in the long wave IR until thermal equilibrium is reached. Reciprocity within the collection optics collimates the radiated light and projects it out within the field of view of the sensor.

Different types of microbolometers have their own signature in the emission. This variation in emission happens at the frequency at which the detectors are biased, e.g., typically the frame rate of the sensor. The signature may be based on the pulse bias intensity and duration (drives amplitude), the device thermal mass, and the device radiative efficiency, such as mass+efficiency, drives harmonics, etc. . . .

Systems in accordance with aspects of the disclosure are able to differentiate between the signatures to detect the presence of a microbolometer and/or type.

In an aspect of the disclosure, the system may comprise a photodiode, an analog to digital converter (ADC) and a processor. The ADC may have a frequency sampling rate of at least two times an expected frequency range of known microbolometers. The ADC may receive an amplified output from the photodiode and produce a sampled sequence using the frequency sampling rate. The processor may convert the sampled sequence into a frequency profile, examine the frequency profile to identify at least a fundamental frequency, determine whether a microbolometer is detected in a line of sight of the photodiode based on the fundamental frequency and issue a detection result to an indicator.

In other aspects, an amplifier may be omitted and the ADC may receive the output directly from the photodiode. In other aspects, the output of the photodiode may be filtered for anti-aliasing.

In other aspects of the disclosure, the system may further comprise an indicator, such as a light, a vibrator or a speaker.

The components of the system may be incorporated into one or more housings. In an aspect of the disclosure, a first housing may include the photodiode and a lens and a second housing may include the ADC and the processor. In other aspects, the ADC may also be included in the first housing.

In an aspect of the disclosure, the system may be handheld.

In other aspects of the disclosure, the frequency sampling rate of the ADC is at least ten times the expected frequency range. In accordance with this aspect, the processor may examine the frequency profile to identify the fundamental frequency, calculate a ratio of amplitude of the frequency profile at the fundamental frequency and the amplitude of the frequency profile at a harmonic frequency for one or more harmonic frequencies and determine a type of microbolometer based on the calculated ratios.

In other aspects of the disclosure, the system further comprises a storage device. The storage device may store types of microbolometers associated with a fundamental frequency, respectively. In other aspects, the storage device may also store a ratio of amplitude of a frequency profile at a fundamental frequency and the amplitude of a frequency profile at a harmonic frequency for one or more harmonic frequencies for different types of microbolometers.

In other aspects of the disclosure, the processor may compare the identified fundamental frequency in the frequency profile with the stored fundamental frequency for the types of microbolometers. When there is a match, the processor determines that the microbolometer is detected.

In other aspects of the disclosure, the processor may compare the calculated one or more ratios with the stored one or more ratios associated with the types. When there is a match, the processor identifies the type that matched as the type of microbolometer.

In other aspects of the disclosure, the photodiode may be a cryogenic photovoltaic device.

Also disclosed is an imaging system that may comprise a long wave infrared camera, analog to digital converters (ADC), a processor and a display. The camera may comprise a lens and a matrix of detection elements, the matrix having a plurality of rows and columns generating image pixels of an image.

Each ADC may have a frequency sampling rate of at least two times an expected frequency range of known microbolometers. Each ADC may receive output from the long wave infrared camera for a pixel and produce a sampled sequence using the frequency sampling rate for each pixel. The processor may convert the sampled sequence into a frequency profile for each pixel, examine the frequency profile for each pixel to identity at least a fundamental frequency, determine whether a microbolometer is present within the image based on the fundamental frequency in each pixel and output a detection result.

In an aspect of the disclosure, the detection result includes a location of the detected microbolometer.

In other aspects, the detection result may be transferred to a host computer in a vehicle. The host computer may transform the location into a vehicle frame or an inertial frame.

In other aspects, the host computer may track the detected microbolometer based on successive detection results.

In other aspects, the vehicle may be an unmanned vehicle. The host computer may change a position of the unmanned vehicle based on the tracking.

In other aspects, the system may further comprise display. The processor may cause the image to be displayed on the display having an indication of the detection result superposed on the displayed image. The indication may be positioned on the pixel in which the microbolometer is detected.

In other aspects, the frequency sampling rate of the ADCs may be at least ten times the expected frequency range. In accordance with this aspect, the processor may examine the frequency profile for each pixel to identify the fundamental frequency, calculate a ratio of amplitude of the frequency profile at the fundamental frequency and the amplitude of the frequency profile at a harmonic frequency for one or more harmonic frequencies and determine a type of microbolometer based on the calculated.

In other aspects, the determined type of microbolometer may be superposed on the image as the detection result.

Also disclosed is a system for detecting microbolometers which may comprise a photodiode, a plurality of filters coupled to the photodiode; a plurality of detectors and a display.

Each detector corresponds to one of the filters. Each detector is configured to output a plurality of detection signals based on whether amplitude is greater than different thresholds. The display is configured to display a representation of the detection signals received from the plurality of detectors.

The plurality of filters may have a central frequency of a known microbolometer, and a bandwidth of +−1 Hz.

In an aspect of the disclosure, the display may comprise a plurality of columns and rows of light indicators. Each column corresponds to one of the plurality of detectors, and each row corresponds to a different intensity.

In an aspect of the disclosure, the detector may comprise a rectifier coupled to a corresponding filter; an integrator coupled to the rectifier; and a plurality of comparators coupled to the integrator. Each comparator has different thresholds. Each comparator is coupled to a different light indicator. The different light indicator is in a different row of the display.

In an aspect of the disclosure the filters are bandpass filters. In other aspects, the filters are matched filters, respectively tuned to a fundamental frequency and harmonic of a known microbolometer.

In an aspect of the disclosure, the representation is based on a maximum of the detection signals received from the plurality of detectors, where the representation represents the type of microbolometer.

Also disclosed is a system for detecting microbolometers comprising: a photodiode, a plurality of matched filters, a plurality of detectors, a selection circuit and display. The plurality of matched filters may be coupled to the photodiode, respectively and tuned to at least a fundamental frequency of a known microbolometer. Each detector corresponds to one of the filters; Each detector configured to output a signal. The selection circuit is configured to output a plurality of selection signals. Each selection signal being based on a comparison of two different signals output from the plurality of detectors. The display is configured to display a representation of the plurality of selection signals.

BRIEF DESCRIPTION OF THE DRAWINGS

FIG. 2A illustrates a block diagram of a processor for the detection system in accordance with aspects of the disclosure;

FIG. 2B illustrates a block diagram of a processor for the detection system in accordance with other aspects of the disclosure;

FIG. 3A illustrates a representative table stored in memory in accordance with aspects of the disclosure;

FIG. 3B illustrates a representative table stored in memory in accordance with other aspects of the disclosure;

FIG. 8 illustrates an example of a table stored in memory with fundamental frequency and harmonic ratios for different types of targets;

DETAILED DESCRIPTION

Figure 1:
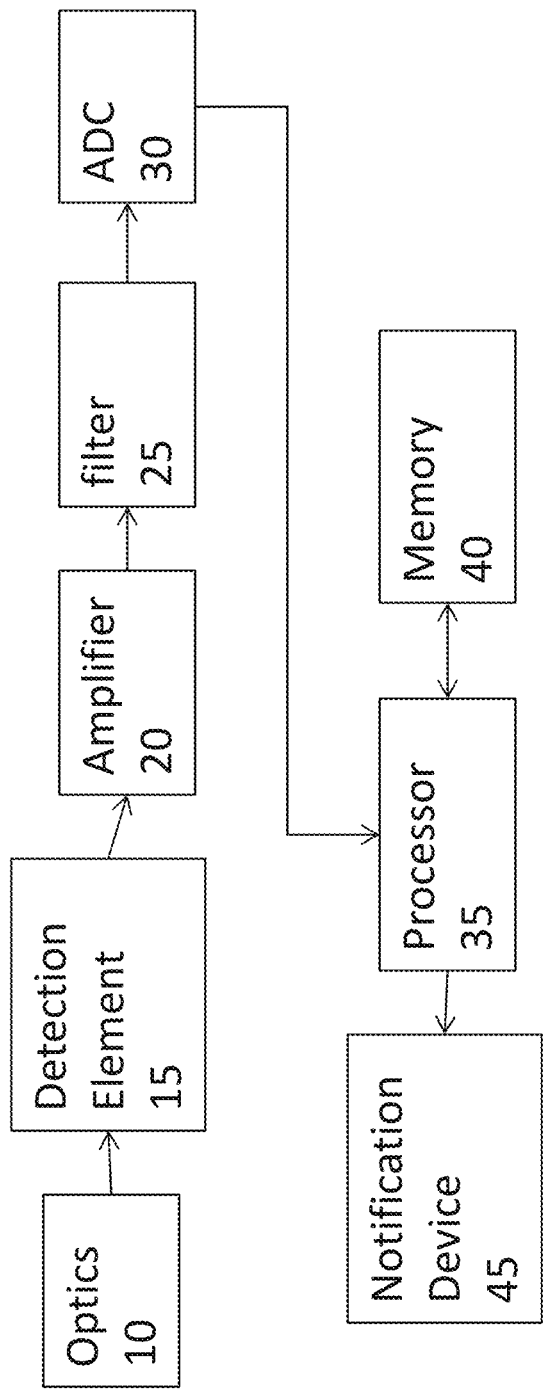
FIG. 1 illustrates a block diagram an example of a detection system in accordance with aspects of the disclosure.

FIG. 1 illustrates a block diagram an example of a detection system 1 in accordance with aspects of the disclosure. The detection system 1 may be used to detect the presence of a microbolometer (target). In other aspects, the detection system 1 may be used to detect the presence of a microbolometer and also determine the type.

The detection system 1 may comprises optics 10. The optics 10 may include one or more lens. The lens may be mounted to a housing (not shown). The housing may have an opening, such as a slit, to allow long wave infrared radiation (LWIR) into the detection system 1. Long wave infrared radiation may have a wavelength between 6 μm-15 μm. In other aspects, LWIR may have a wavelength between 8 μm-12 μm. In some aspects, the opening may be covered. The cover may be transmissive for the LWIR. In other aspects, the entire housing may be made of a material transmissive to LWIR.

The lens may be a plano-convex lens. The lens may be Zinc Selenide ZnSe. A ZnSe lens is designed for the infrared spectrum. However, in other aspects, other materials may be used.

In some aspects, the lens may be coated to improve transmission efficiency for a specific range of wavelengths. For example, a broadband anti-reflection (BBAR) coating may be used.

The coating may be set for a desired wavelength range, such as described above, e.g., 8 µm-12 µm or 6 µm-15 µm.

The size of the lens, number of lens and focal length, may be defined based on a desired size for the system 1. Smaller lens and focal lengths may be used where the system 1 is desired to be small and portable. Larger lens and focal lengths may be used where the system 1 is fixed, such as mounted to a vehicle, such as an airplane, helicopter, boat, truck, bus, motorcycle, submarine, UAV, etc.

For example, a lens has a diameter of about 50 mm and has a focal length of 100 mm.

In some aspects of the disclosure, the optics 10 may have a filter. The size of the filter may match the lens. The filter may be tuned to a specific wavelength band based on the desired wavelength range.

The system 1 may comprise a detection element 15. For example, the detection element 15 may be a photodiode. The photodiode may be a cryogenic photovoltaic device. This device has low noises and very high intrinsic bandwidths. The photodiode is positioned based on the focal length of the lens.

In an aspect of the disclosure, the photodiode may be made of Mercury Cadmium Telluride (HgCdTe). For example, a J15D12 Series HgCdTe PC Detector from Teledyne Judson Technologies may be used. However, other materials may be used for the detector. In order to maintain the photodiode at a target temperature, a cryogenic storage dewar may be used with liquid nitrogen coolant. Liquid nitrogen is poured into the dewar. The evaporation of the liquid nitrogen cools the dewar's cold head and the detector to approximately 77K.

In other aspects of the disclosure, other types of detection elements 15 may be used. For example, thermoelectrically cooled or room temperature photovoltaic or photoconductive semiconductor devices may be used instead.

The photodiode converts the LWIR into a photocurrent. This current may need to be amplified for signal processing. In an aspect of the disclosure, the system 1 may have an amplifier 20. For example, a model PA-101 preamp from Teledyne Judson Technologies may be used. The amplifier may be matched to the detection element 10. The PA-101 has built-in bias circuitry. However, the amplifier is not limited to the above model, but may be other amplifiers with a low noise, high gain and wide bandwidth. In some aspects of the disclosure, the gain may be 100×. In other aspects, the gain may be 1000×. In some aspects, the bandwidth may be 10 Hz-200 kHz.

The system 1 may also have a filter 25. The filter 25 may be used for anti-aliasing. In an aspect of the disclosure, the filter 25 may be a low pass filter. In other aspects of the disclosure, the filter 25 may be a band pass filter. This may be used where a small number of types of microbolometers are desired to be detected.

The system 1 may also have an analog to digital converter (ADC) 30. The ADC 30 will have a sampling rate. In an aspect of the disclosure, where the system 1 is for only detecting the presence of a microbolometer, the sampling rate may be set to at least 2× the pulse bias rate for known microbolometers. Known microbolometers have different pulse bias rates. For example, certain known microbolometers may have a rate of 10 Hz. Other known microbolometers have a rate of 30-60 Hz. Other known microbolometers may have a rate of 25-50 Hz. Thus, the sampling rate may be set to at least 120 Hz. This setting meets the Nyquist bandwidth requirement and also allows for the rejection of background thermal energy.

In some aspects of the disclosure, the sampling rate may be set prior to the system 1 being deployed such as part of configuring the system. In other aspects, the sampling rate may be updated as additional types of microbolometers are known having higher pulse rates.

In other aspects of the disclosure, where the system 1 is for detecting the presence of a microbolometer and the type, the sample rate may be set to at least 10-20× the pulse bias rate of known microbolometers. This allows Nyquist measurement of the first 5-10 harmonics of the fundamental frequency. Ratios of the fundamental frequency and one or more harmonics may be used to determine the type. As above, the sampling rate may be set prior to the system 1 being deployed such as part of configuring the system. In other aspects, the sampling rate may be updated as additional types of microbolometers are known having higher pulse rates.

The ADC 30 may receive an amplified and filtered voltage sequence representing light which is received by the system 1 (detection element 15).

The system 1 may also include a processor 35 and memory 40. The processor 35 may be an FPGA. In other aspects of the disclosure, the processor 35 may be a microcontroller or microprocessor or any other processing hardware such as a CPU or GPU. Memory 40 may be separate from the processor 35 (or integrated in the same). For example, the microcontroller or microprocessor includes at least one data storage device, such as, but not limited to, RAM, ROM and persistent storage. In an aspect of the disclosure, the processor 35 may be configured to execute one or more programs stored in a computer readable storage device. The computer readable storage device can be RAM, persistent storage or removable storage. A storage device is any piece of hardware that is capable of storing information, such as, for example without limitation, data, programs, instructions, program code, and/or other suitable information, either on a temporary basis and/or a permanent basis.

The system 1 may also include a notification device 45. The notification device 45 may indicate the result of the detection and/or the type.

In an aspect of the disclosure, the notification device 45 may be a light indicator, e.g., LED. The LED may have different colors depending on the result of the detection and/or type. In other aspects, the LED may have different timing patterns depending on the result of the detection and/or type.

In other aspects, the notification device 45 may be a vibrator. The vibrator may vibrate when a microbolometer is detected. Additionally, the vibrator may have different vibrations depending on the type of the detected microbolometer.

In other aspects, the notification device 45 may be a speaker and the speaker may output an alarm when a microbolometer is detected. Additionally, the speaker may state the type of microbolometer that is detected.

In other aspects, the notification device 45 may be a display. The detection result may be displayed on the display such as "yes" or "no" and/or the type of microbolometer.

FIG. 2A illustrates a block diagram of the processor 35 in accordance with aspects of the disclosure for a detection system which detect the presence of a microbolometer. FIG. 3A illustrates a representative table for the detection system 1 which detects the presence of a microbolometer in accordance with aspects of the disclosure.

The processor 35 may comprise a digital filtering module 200 and a detection module 205. The digital filtering module 200 receives the sampled sequence from the ADC 30 (sampled at the sampling rate and representing a digital output corresponding to light detected by the system) and filters the same to suppress background and noise. For example, a plurality of digital bandpass filters may be used. Each bandpass filter may have a center frequency and bandwidth tuned to one or more known microbolometer targets. The bandpass filters may be one or more convolutional finite impulse response (FIR) or infinite impulse response (IIR) filters.

Figure 9A:
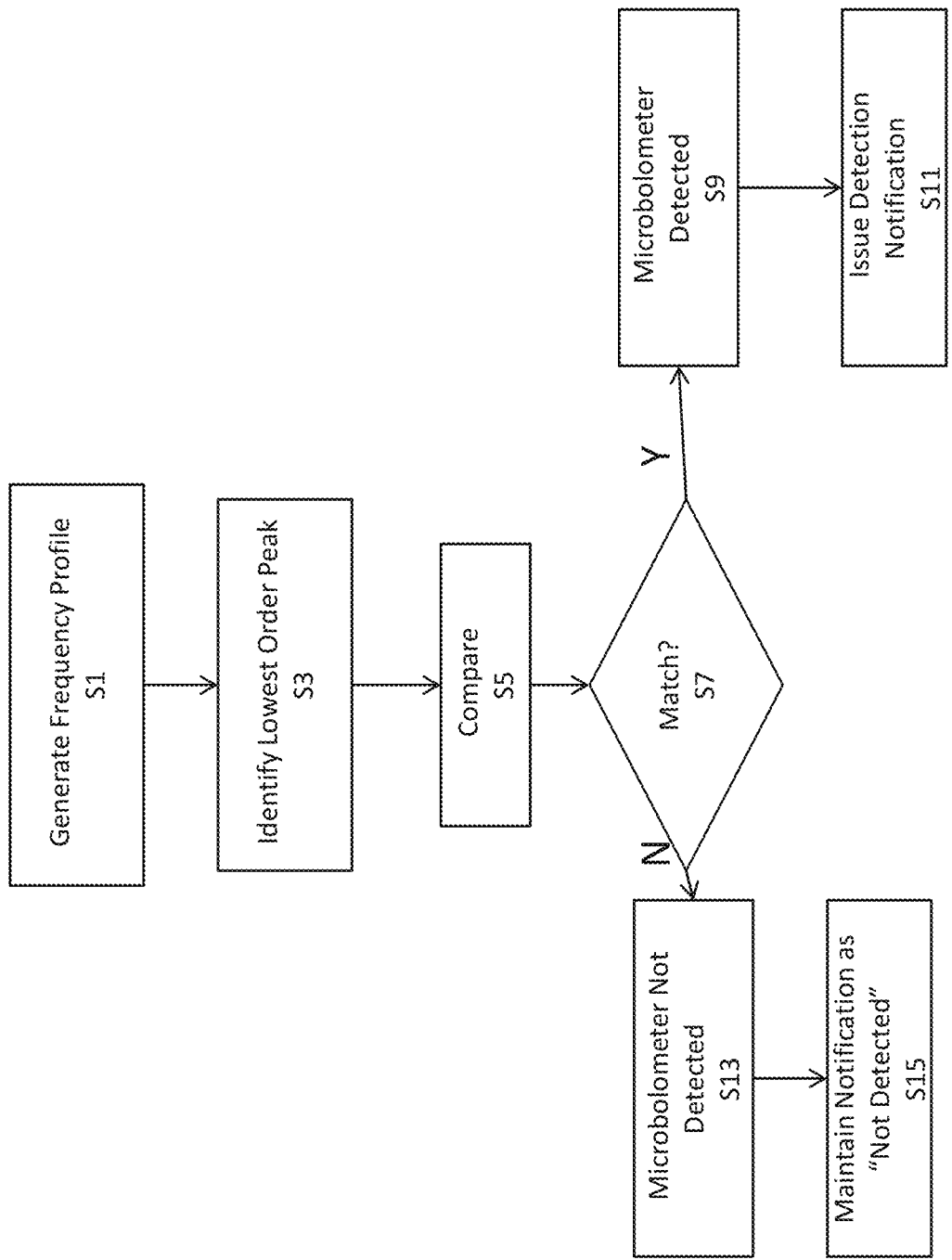
FIG. 9A illustrates a flow chart for the detection module in accordance with aspects of the disclosure.

The detection module 205 is used to determine whether a microbolometer is present in a line of sight of the system 1 (such as line of sight with the photodiode). The detection module 205 will be described with respect to FIG. 9A. The detection module 205 is executed by the processor 35. The following description will refer to "the detection module 205" for clarity and not "the processor executing the detection module".

Figure 5:
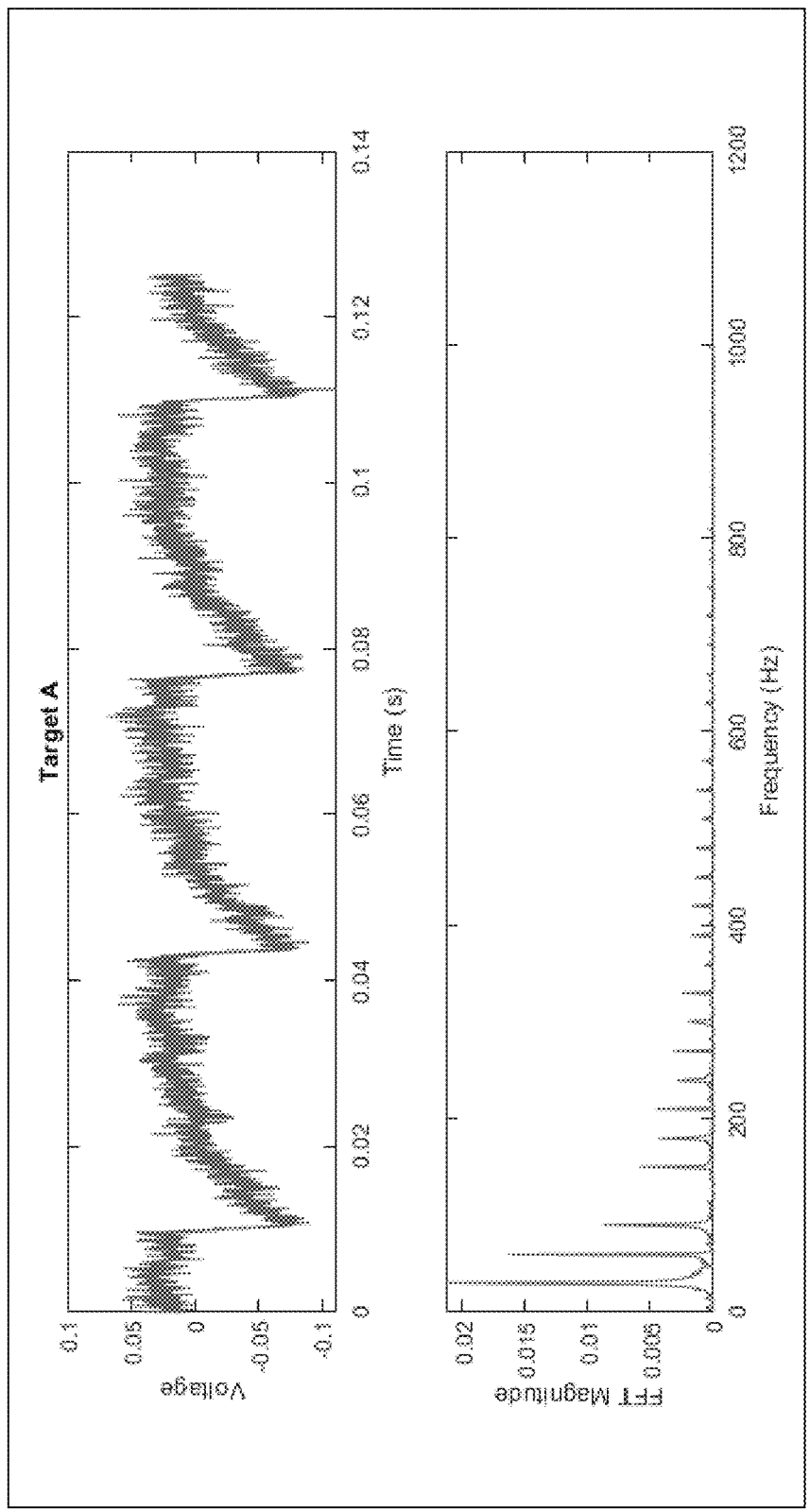
FIGS. 5-7 illustrate examples of a sampled output and frequency profile for different targets.

The detection module 205 receives the sampled sequence which is digitally filters and generates a frequency profile. For example, the detection module 205 executes a Fast Fourier Transformation (FFT) which converts the sampled sequence (time) into the frequency domain. An example of a frequency profile is shown in FIG. 5 (for target A) on the bottom. An example of the sampled sequence is shown in FIG. 5 (for target A) on the top. The FFT may be performed before or after filtering.

At S3, the detection module 205 identifies the lowest order peak, e.g., fundamental frequency. The detection module 205 examines the frequency profile (FFT magnitude) to find the lowest order peak. The lowest order peak is a smallest frequency having a peak. This is the fundamental frequency.

As shown in FIG. 3A, the memory 40 contains a table having a list of targets, e.g., known types of microbolometers, e.g., representative targets A . . . n, and a corresponding fundamental frequency, e.g., representative fundamental frequencies F1 . . . Fn. This is stored in a one-to-one correspondence. The known types of microbolometers and its corresponding fundamental frequency may be stored in advance during configuration. In other aspects, the correspondence may be updated as other types of microbolometers are known and fundamental frequency (pulse rate) are characterized.

In other aspects of the disclosure, the detection module 205 may be a frequency domain digital anomaly detector. This may be used for unknown microbolometers. For example, a discrete Fourier transform (DFT) may be used. Frequency abnormalities may be detected when the frequency profile has amplitude that measures at statistically anomalous amplitudes. Thresholds for detection may be defined and updated based on measurements of the system noise floor to meet a system defined false alarm rate. In this aspect, an alert may be generated indicating a potential unknown type of microbolometer.

At S5, the detection module 205 retrieves the table from memory 40 and compares the identified lowest order peak, e.g., detected fundamental frequency, with the fundamental frequencies stored in the table. At S7, the detection module 205 determines if there is a match, e.g., the detected fundamental frequency matches a stored fundamental frequency in the table. A match may be determined when the frequencies are substantially the same. Substantially the same means that they are within a matching threshold range. For example, the matching threshold range may be +−1 Hz. The matching threshold range is not limited to the above example and other ranges may be used.

When there is a match ("Y" at S7), the detection module 205 determines that a microbolometer is detected at S9. The detection module 205 may then instruct the notification device 45 to issue a notification that a microbolometer is detected at S11.

On the other hand, when there is no match ("N" at S7), the detection module 205 determines that a microbolometer is not detected at S13. "No match" means that a measured frequency is not substantially the same as a stored fundamental frequency or that the amplitudes associated with the frequency profile do not exceed a detection threshold at a current false alarm rate. The false alarm rate is to prevent spurious false detections. Thus, the detection module 205 may further require for a match that the amplitude of the fundamental frequency exceed the false alarm rate. The false alarm rate may be defined as a multiple of the noise floor of the measurement. For example, the multiplier may be 6 or more. The detection module 205 may then instruct the notification device to issue a notification that a microbolometer is not detected S15 or maintain the current notification state.

In other aspects, the detection module 205 may identify unknown microbolometers. For example, in this aspect of the disclosure, if the determined fundamental frequency does not match a fundamental frequency in the table, but the amplitude is higher than the false alarm rate, the detection module 205 may instruct the notification device to issue a notification for an unknown microbolometer type.

FIG. 2B illustrates a block diagram of the processor 35A in accordance with aspects of the disclosure for a detection system which detect the presence of a microbolometer and the type. FIG. 3B illustrates a representative table for the detection system 1 which detects the presence of a microbolometer and the type in accordance with aspects of the disclosure.

The processor 35A may comprise a digital filtering module 200A, a detection module 205 and a discrimination module 210. The digital filtering module 200A may comprise a matched filter banks such as convolution matched filters, each tuned to the fundamental frequencies and one or more harmonics for a known microbolometer. The detection module 205 may be the same as described above.

Figure 9B:
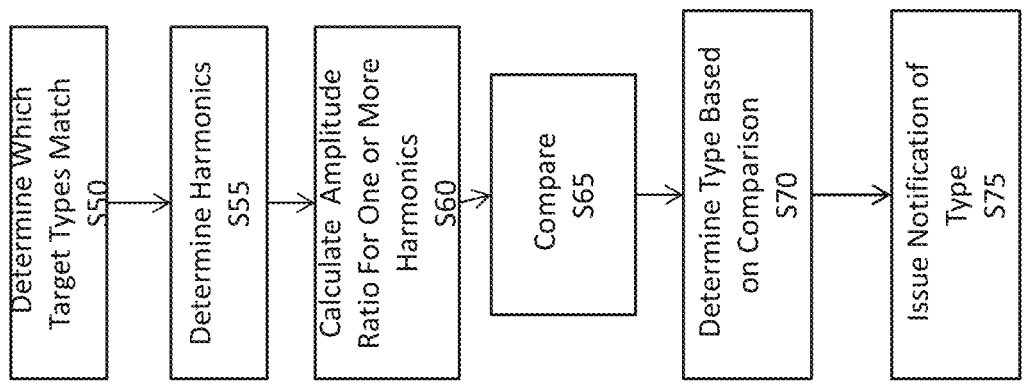
FIG. 9B illustrates a flow chart for the discrimination module in accordance with aspects of the disclosure.

The discrimination module 210 will be described with respect to FIG. 9B. The discrimination module 210 is executed by the processor 35A. The following description will refer to "the discrimination module 210" for clarity and not "the processor executing the discrimination module".

The discrimination module 210 may receive the frequency profile generated by the detection module 205.

At S50, the discrimination module 210 determines which type(s) of microbolometer, e.g., target(s), matched in S7 with reference to the table depicted in FIG. 3B stored in memory 40A. The table in FIG. 3B is similar to the table in FIG. 3A in that it also has the fundamental frequency associated with target, but the table also includes ratios of amplitudes of the frequency profile at fundamental frequency and harmonics. The discrimination module 210 retrieves the table and identifies the target(s) having the match (substantially the same as described above). There may be multiple targets which match and these targets become candidates. In other aspects of the disclosure, S50 may be skipped and a candidate is identified solely from the ratio(s) of the fundamental frequency to harmonics.

Figure 6:
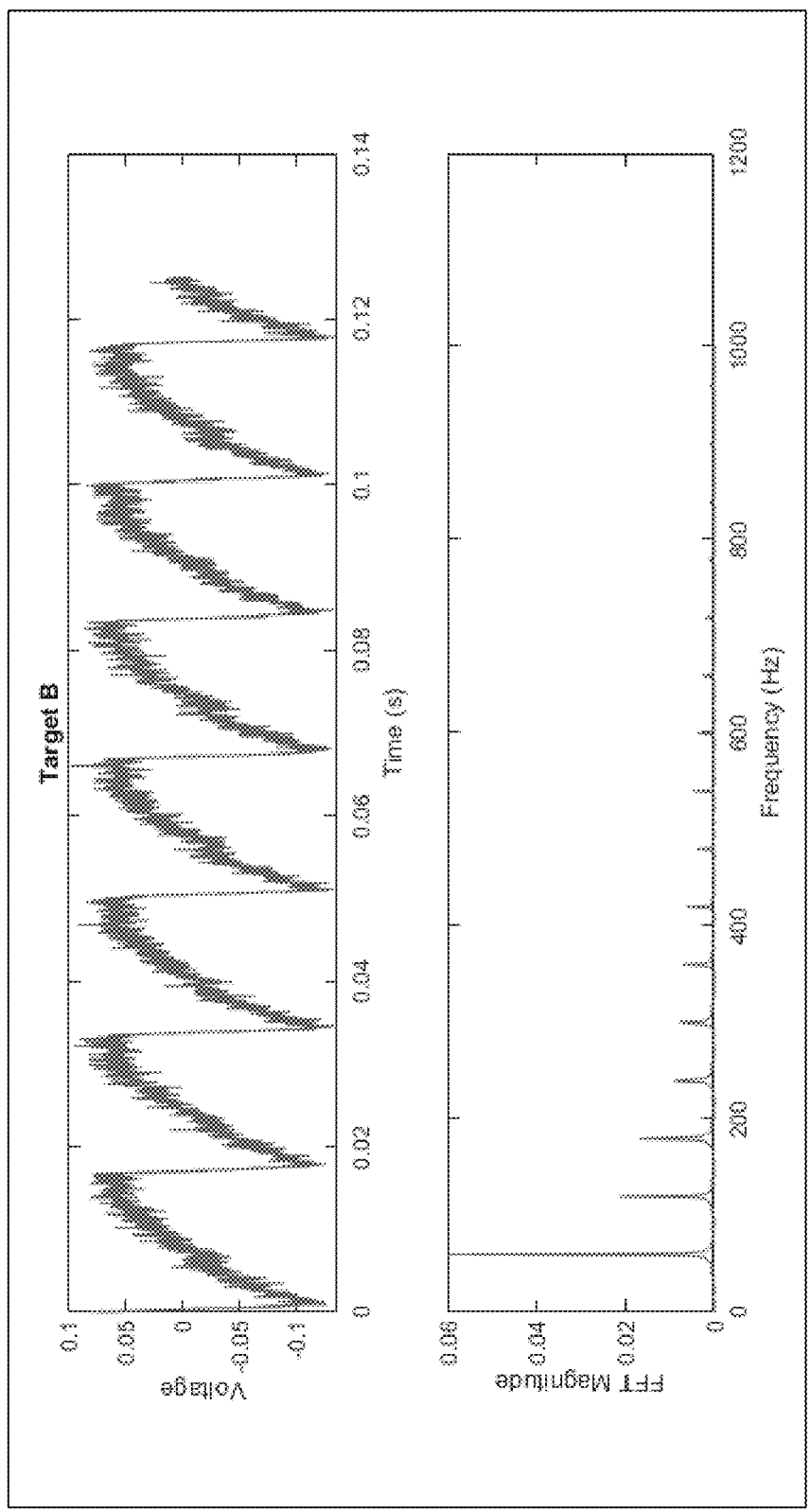
Figure 7:
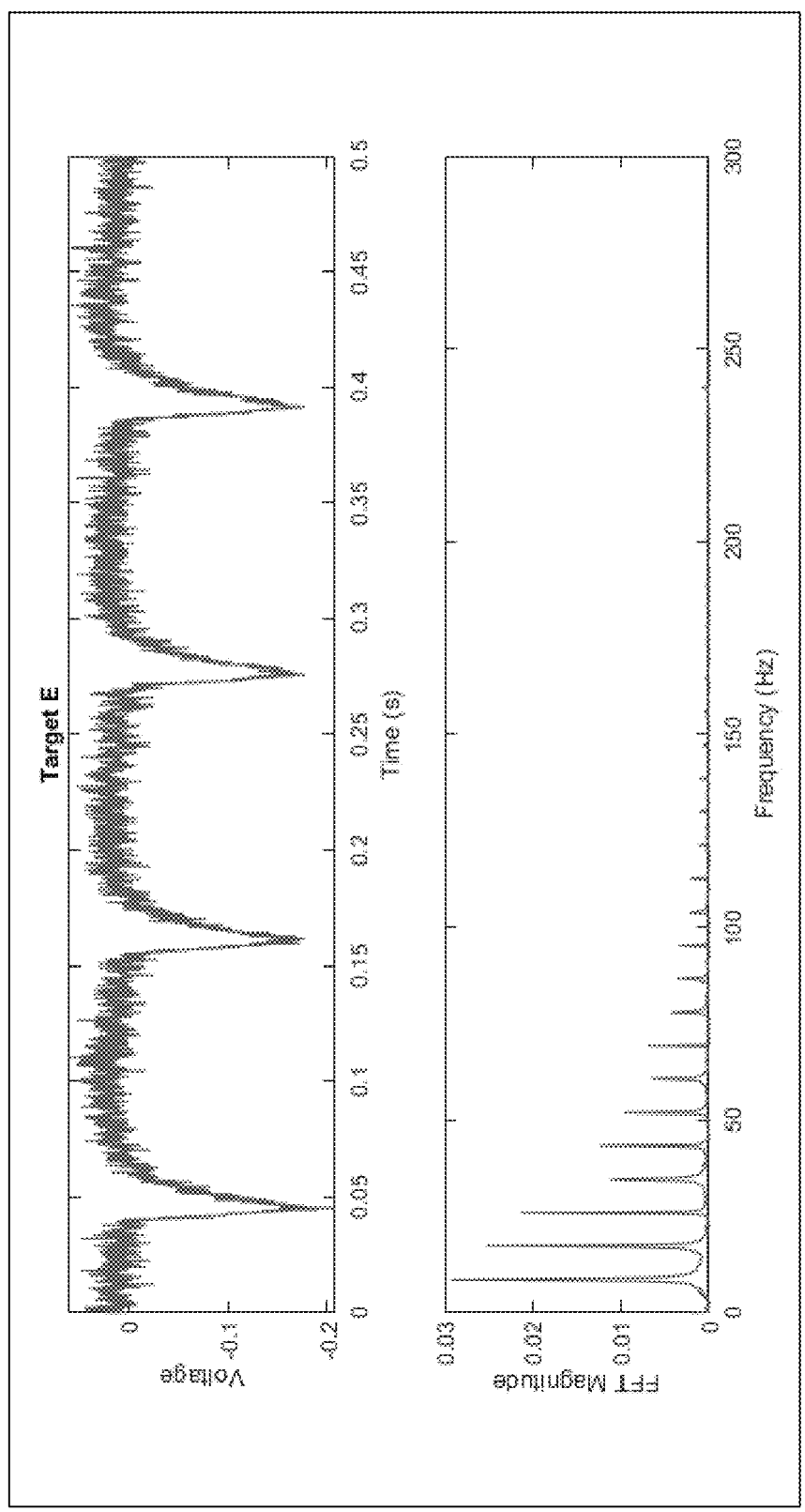

At S55, the discrimination module 210 examines the frequency profile to determine the amplitude at one or more harmonics in the frequency profile. The harmonics are integer frequency multiples of the fundamental frequency. In an aspect of the disclosure, the discrimination module 210 identifies the amplitude for preset number of harmonics. For example, the discrimination module 210 may identify the amplitude for the first four harmonics. However, the number of harmonics is not limited to the first four and other numbers of harmonics may be used. For example, only the first two harmonics may be used. FIGS. 5-7 depicts examples of the frequency profile showing the amplitude at fundamental frequencies and harmonics for different types such as Target A (FIG. 5), Target B (FIG. 6) and Target E (FIG. 7).

The amplitudes may be temporarily stored.

At S60, for each amplitude of the preset number of harmonics, the discrimination module 210 calculates a ratio of the amplitude of the identified fundamental frequency and amplitude of the respective harmonic. For purposes of the description, 1:0 represents an amplitude ratio of the frequency of the first harmonic and the fundamental frequency, 2:0 represents an amplitude ratio of the frequency of the second harmonic and the fundamental frequency, . . . etc.

Thus, when the preset number of harmonics is four, the discrimination module 210 calculates four ratios. These ratios may be temporarily stored.

At S65, the discrimination module 210 compares the calculated ratios with the prestored ratios in the table of FIG. 3B. FIG. 8 shows an example of the ratios for six known types of microbolometers, Target A, B, D, E, G and H. (ratios for the first to fourth harmonic frequencies are shown).

When S50 is performed, the discrimination module 210 may only compared the ratios for the identified candidates.

At S70, the discrimination module 210 determines the type of microbolometer based on the comparison. The microbolometer is the type that has the stored ratios matching the calculated ratios. For example, the discrimination module 210 may determine the most closely matching of the candidates. For example, the most closely matching may be determined by distance metric. The distance metric may be a minimum root-sum-squared of the ratios. The root-sum-squared computes a square root of the sum of the squared differences between the measured ratios and the stored ratios for each candidate. In other aspects, a weighted root-sum-squared of the ratios may be used. In a weighted root-sum-squared, the ratios are weighted by coefficients prior to summation.

At S75, the discrimination module 210 instructs the notification device 45 to indicate the determined type.

Figure 4:
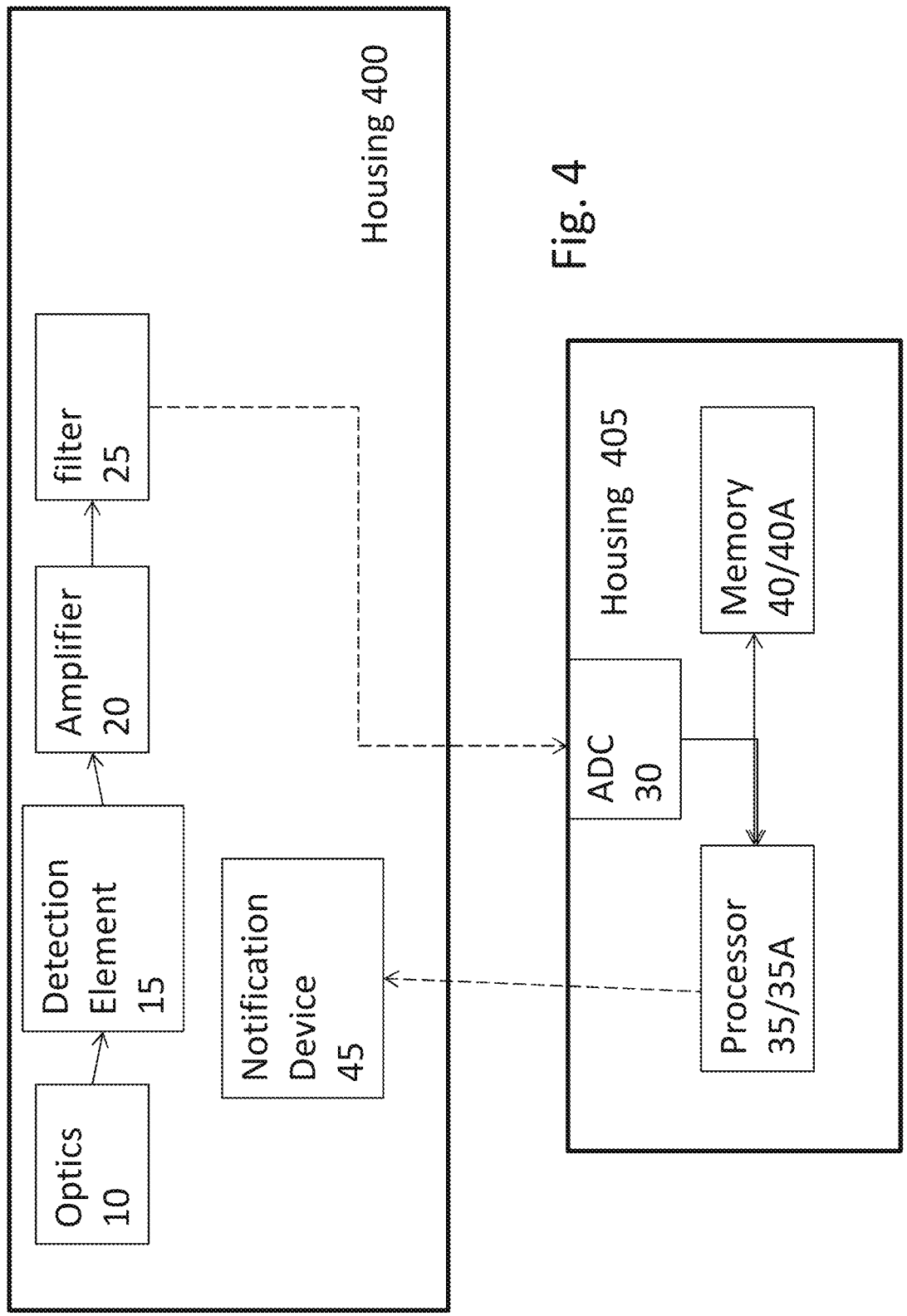
FIG. 4 illustrates a block diagram of another example of a detection system in accordance with aspects of the disclosure.

FIG. 4 illustrates a system in accordance with other aspects of the disclosure. In FIG. 4, the components of the system are divided into two different housings 400, 405. For example, the optics 10, detection element 15, amplifier 20, optional filter 25 and notification device 45 are incorporated in housing 400. The ADC 20, processor 35/35A and memory 40/40A are incorporated in housing 405. In this aspect of the disclosure, housing 400 is portable. For example, the components may be incorporated in a portable device such as a mobile phone or a detection wand. The wand may be pointed to a target device of interest. For example, the detection element 15 may be pointed in the direction of an unknown device of interest. Housing 405 may be attached to a vehicle such as an airplane, helicopter, car, bus, truck, boat, motorcycle, submarine, UAV, etc . . . .

As depicted, the optional filter 25 and ADC 20 may be connected to each other via connection cables. In other aspects of the disclosure, the housing 400 and housing 405 may respectively include wireless interfaces and the components communicate via wireless communication.

In other aspects of the disclosure, housing 400 may be rotatably mounted to a vehicle such as a airplane, helicopter, car, bus, truck or boat, motorcycle, submarine, UAV, etc. . . . . . As the housing 400 rotates, the detection element 15 is in line of sight of different areas. In this aspect of the disclosure, when a microbolometer is detected, the angle of rotation may be identified or stored and used for determining the location of the microbolometer.

Figure 10A:
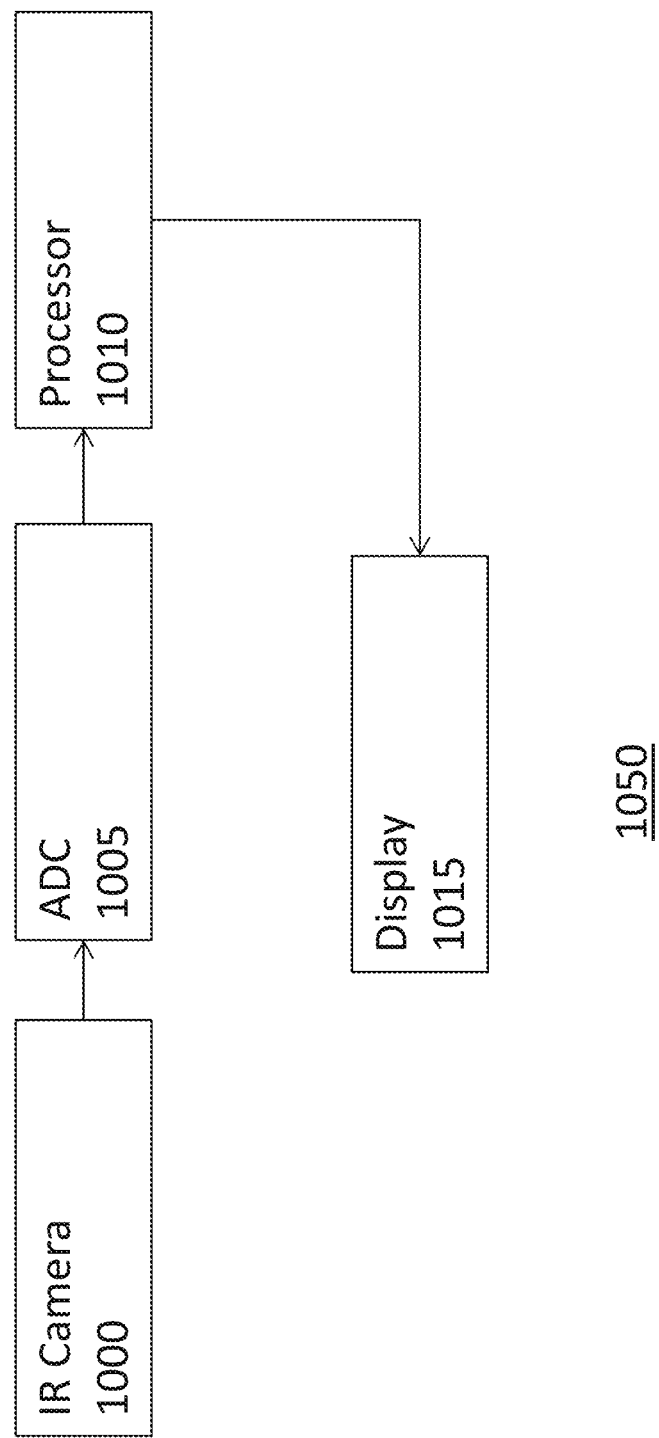
FIG. 10A illustrates a block diagram of an imaging system in accordance with aspects of the disclosure.

FIG. 10 illustrates a block diagram of an imaging system 1050 in accordance with aspects of the disclosure.

The system 1050 may comprise a LWIR camera 1000. The LWIR camera 1000 may include a focal plane array (FPA). The FPA may be a strained layer superlattice (SLS). However, other types of FPA may be used. The LWIR camera 1000 may comprise one or more lens which focus and collect the LWIR onto the SLS. The SLS has a plurality of rows and columns. The intersection of the rows and columns represented a pixel of an image. The LWIR camera 1000 may also comprise a readout circuit (ROIC) that drives FPA, collects and stores the detection result for each pixel. In an aspect of the disclosure, the LWIR camera 1000 may be mounted to a vehicle such as an airplane, helicopter, car, bus, truck, boat, motorcycle, submarine, UAV, etc. . . . . . The mounting may have the LWIR camera 1000 face in a fixed position. The fixed position, e.g., mounting angle, is preset. This angle may be stored in storage and used by a processor 1010 to determine a location of the microbolometer relative to the LWIR camera 1000. In other aspects, the LWIR camera 1000 may be rotatably mounted to the vehicle. The angle may be continuously monitored and the angle used by the processor 1010 to determine a location of the microbolometer relative to the LWIR camera 1000. The processor 1010 may also be configured to control the ROIC.

The ROIC is connected to ADCs 1005. In an aspect of the disclosure, the ADCs 1005 may be incorporated in the LWIR camera 1000. In some aspects, the digital IR signals may be input to a processor 1010 via a multiplexor. The processor 1010 may be configured to generate an image from the digital IR signals.

The image may be displayed on a display 1015.

Additionally, the processor 1010 may also include the digital filtering module 200, the detection module 205 and/or the discrimination module 210 as described above. The processor 1010, executing the detection module 205 may determine whether a microbolometer is present in any of the pixels within the image, e.g., determination is made per pixel. In an aspect of the disclosure, the pixels may be identified by x and y coordinates (indices). Since the determination is made per pixel, the location of the microbolometer may be determined in the image frame. When it is determined that a microbolometer is present in a pixel or a group of pixels, an indication may be superposed on an image. In an aspect of the disclosure, the indication may be an outline surrounding the pixel or pixels. In other aspects of the disclosure, the indication may be an arrow pointing to the pixel or group of pixels. In other aspects, the indication may be a pop up text box stating that a microbolometer is detect. In this aspect, the pop up text box may state the pixel row and column number. The overlay, e.g., indication, may be augmented with additional information such as detection strength, identification confidence, fundamental frequency, etc.

In other aspects of the disclosure, instead of and/or in addition to, the pixels may be converted to an angular offset. For example, since the angle of the camera is known, for narrow fields of view the conversion may be performed linearly by scaling the detection indices by the angle subtended by each pixel. In other aspects, where the field of view is wider, a polynomial function may be used to scale the detection indices to angles. In other aspects, where the angle of the camera 1000 is fixed, a conversion table may be used to convert the detection indices to angles. These angles are with respect to the camera frame, e.g., camera.

Figure 10B:
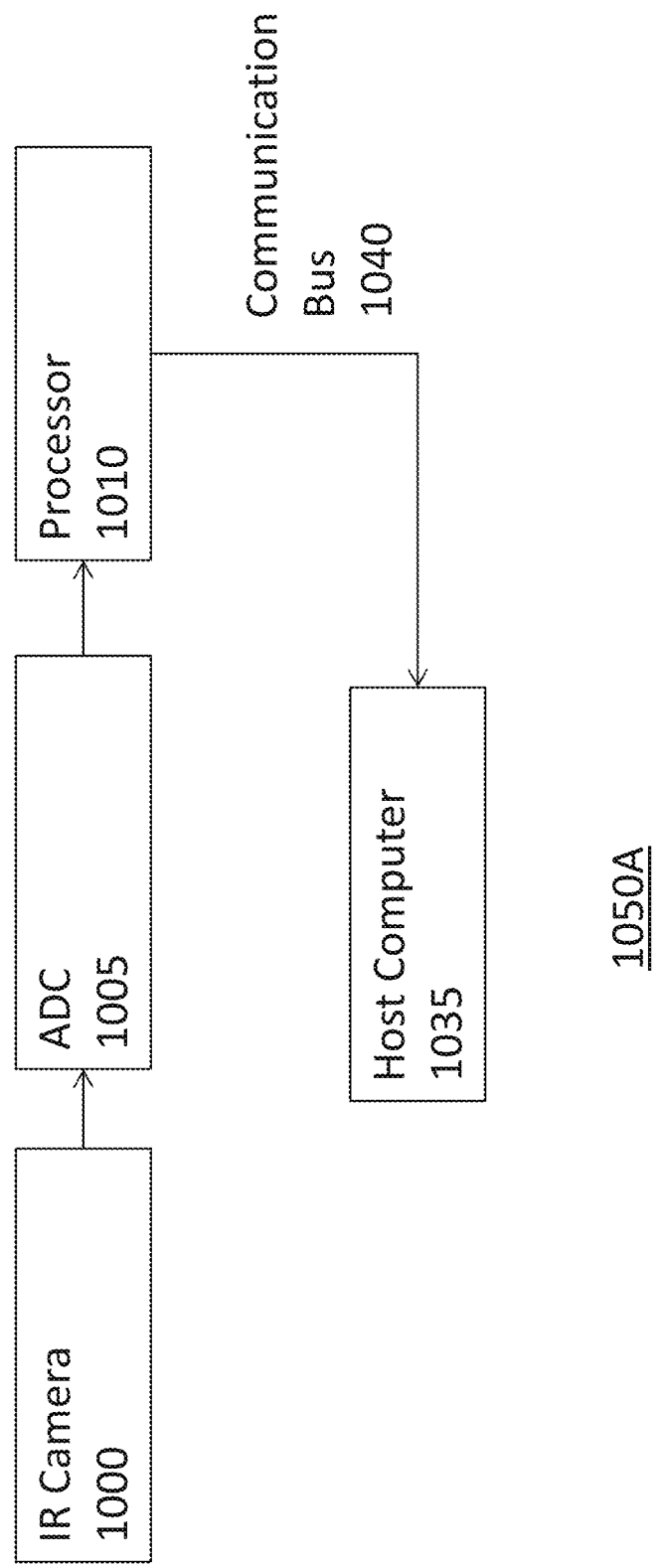
FIG. 10B illustrates a block diagram of another imaging system in accordance with aspects of the disclosure.

In other aspects of the disclosure, instead of and/or in addition to, the detection result and location information may be transfer to a host computer 1035 via a communication bus 1040 as shown in FIG. 10B. In this imaging system 1050A, the host computer 1035 may be a mission computer in a vehicle where the LWIR camera 1000 is mounted to. In an aspect of the disclosure, the host computer 1035 may transform the detection location received from the processor 1010 via the communication bus 1040 from the camera frame to a host platform frame (vehicle frame) by use of discrete cosine matrices or quaternion rotations. As noted above, the LWIR camera 1000 may be mounted at a fixed angle. The orientation of the camera may be determined through a calibrated installation. In other aspects of the disclosure, the orientation of the camera may be determined via measurement of gimbal rotation angles or an inertial measurement unit, or a combination thereof.

Additionally, in other aspects of the disclosure, the detection location may be geolocated by transforming the detection into a geocentric coordinate frame. For example, the vehicle may have a local digital terrain map. The host computer 1035 may transform the vector associated with the target detection (from the vehicle frame) into a geocentric coordinate frame via discrete cosine matrices or quaternion rotations (e.g., inertial frame). In the inertial frame, the host computer 1035, by compare the transformed coordinates with the digital map by casting the detection vector from the host platform location, may determine the location. For vectors which intersect the ground, the approximate target location may be inferred at the intersection of the vector and terrain map. For vectors which do not intersect the ground or with target types not required to be on the ground, the range ambiguity of the target may be resolved by including maximum anticipated detection ranges or a detection strength vs. range estimate in the above described table(s). For example, for each known type of microbolometer, which populating the table, the microbolometer may be moved to different ranges from the LWIR camera 1000. The maximum detection range may be recorded. Thus, in use, when the microbolometer is detected, the system knows that the microbolometer is within the maximum detection range from the LWIR camera 1000.

In an aspect of the disclosure, the platform location (such as the vehicle) may be determined via GPS, LORAN, an inertial navigation system, or any similar method. Local maps may be obtained through existing topological databases such as the Digital Terrain Elevation Data (DTED).

In other aspects of the disclosure, a series of detections and location vectors may be used as inputs to a tracker over time. The tracker may operate in any of the coordinate frames, e.g. camera, host platform (vehicle), or geospatial (inertial). In an aspect of the disclosure, the host computer 1035 may execute the tracking. The tracker may be used to associate successive detections, discriminate between multiple simultaneous detections, and/or estimate target trajectories and/or velocities.

In other aspects of the disclosure, the outputs from the tracking may be used by the host platform (e.g., vehicle). For example, geolocated targets may be automatically tagged and distributed for intelligence purposes. In an aspect of the disclosure, an autonomous airborne system (such as a UAV) may incorporate location information within a flight planning computer to route towards or away from the microbolometer target as needed.

While FIG. 10B illustrates the processor 1010 and the host computer 1035 as separate elements, in other aspects, the host computer 1035 may execute the functionality described with respect to the processor 1010, e.g., host the processor.

In other aspects, when the processor 1010 also executes the discrimination module 210 to determine the type of microbolometer, the indication which is superposed on the image may also indicate the type. For example, the pop up text box may include text corresponding to the identified type. In other aspects, the pixel or pixel group where the microbolometer is located may change to a specific color for a specific type. In other aspects, the indication may be a window superposed on the image. The window may have different hashing for a specific type.

When the processor 1010 determines the type of the microbolometer, the processor 1010 may transfer information indicating the type of the microbolometer to the host computer 1035 (along with the position information). In some aspects of the disclosure, the host computer 1035 may execute certain processes in response to the different detected types of microbolometer. For example, depending on the vehicle (platform) and mission, the different processes may include, but are not limited to, one or more of automatic tracking, reporting, targeting, avoidance or countermeasures.

In other aspects of the disclosure, the system may further include a communication interface. The communication interface may be wireless interface. The communication interface may be configured to communicate with an external system on a ground. For example, the communication interface may communicate with air traffic control. In this aspect, the detection result including the location (and type) may be communicated to the air traffic control. The ground is not limited to air traffic control. Other ground systems may include, but are not limited to law enforcement, intelligence databases or artillery batteries, depending on the detection location and/or type.

In other aspects of the disclosure, the system may receive instructions from the ground via the communication interface. The instructions may be based on the detection result (including location and type). For example, air traffic control may instruct a vehicle to change its location based on the detection result.

In an aspect of the disclosure, the display may be a heads up display (HUD). In other aspects of the disclosure, the display may be a head mounted display (HMD). When the display is a HUD or HMD, the location of the detected microbolometer may be translated to vehicle frame (platform frame) or an inertial frame.

In other aspects of the disclosure the ADC 30 may be omitted and the detection of a microbolometer and type thereof may be based on analog signal processing instead of the digital filtering and processing description above.

Figure 11:
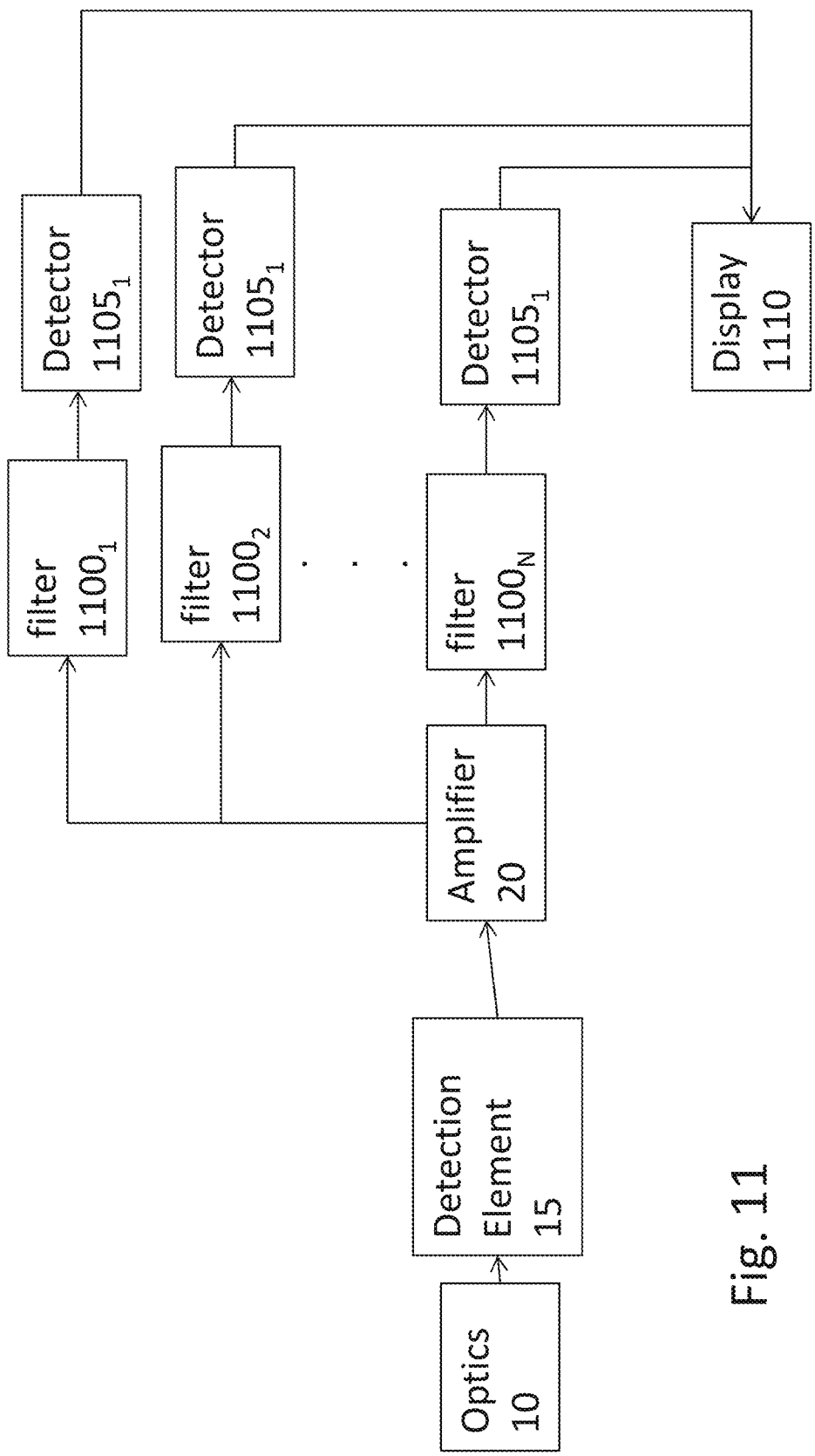
FIG. 11 illustrates a block diagram of another example of a detection system in accordance with aspects of the disclosure.

For example, FIG. 11 illustrates a block diagram of an analog system in accordance with aspects of the disclosure. The analog system may include the optics 10, the detection element 15 and the amplifier 20 described above. The received light signal, which is amplified by the amplifier 20, is buffered. The system may also comprise a plurality of analog filters $1100_{1-N}$ (individually references as 1100 or by filter number). Each of these analog filters 1100 may be a bandpass filter. These bandpass filters may be individually tuned to filter a known microbolometer, e.g., fundamental frequency and respective harmonics. The bandpass filters may have a bandwidth of +−1 Hz. For example, Filter 1 1100$_1$ may have a central frequency of 30 Hz+−1 Hz, which is for microbolometers with one common a fundamental frequency. Filter 2 1100$_2$ may have a central frequency of 60 Hz+−1 Hz, which is for microbolometers with another common fundamental frequency. The number N of filters may be based on a number of known types of microbolometers, e.g., common fundamental frequencies. In other aspects, the number N of filters may be based on an application, e.g., desired detection target. In other aspects, the number N of filters may be based on whether the system is designed to discriminate the type of target based on amplitude ratios of fundamental frequency and harmonics (also referred to as intensity ratios).

Figure 12:
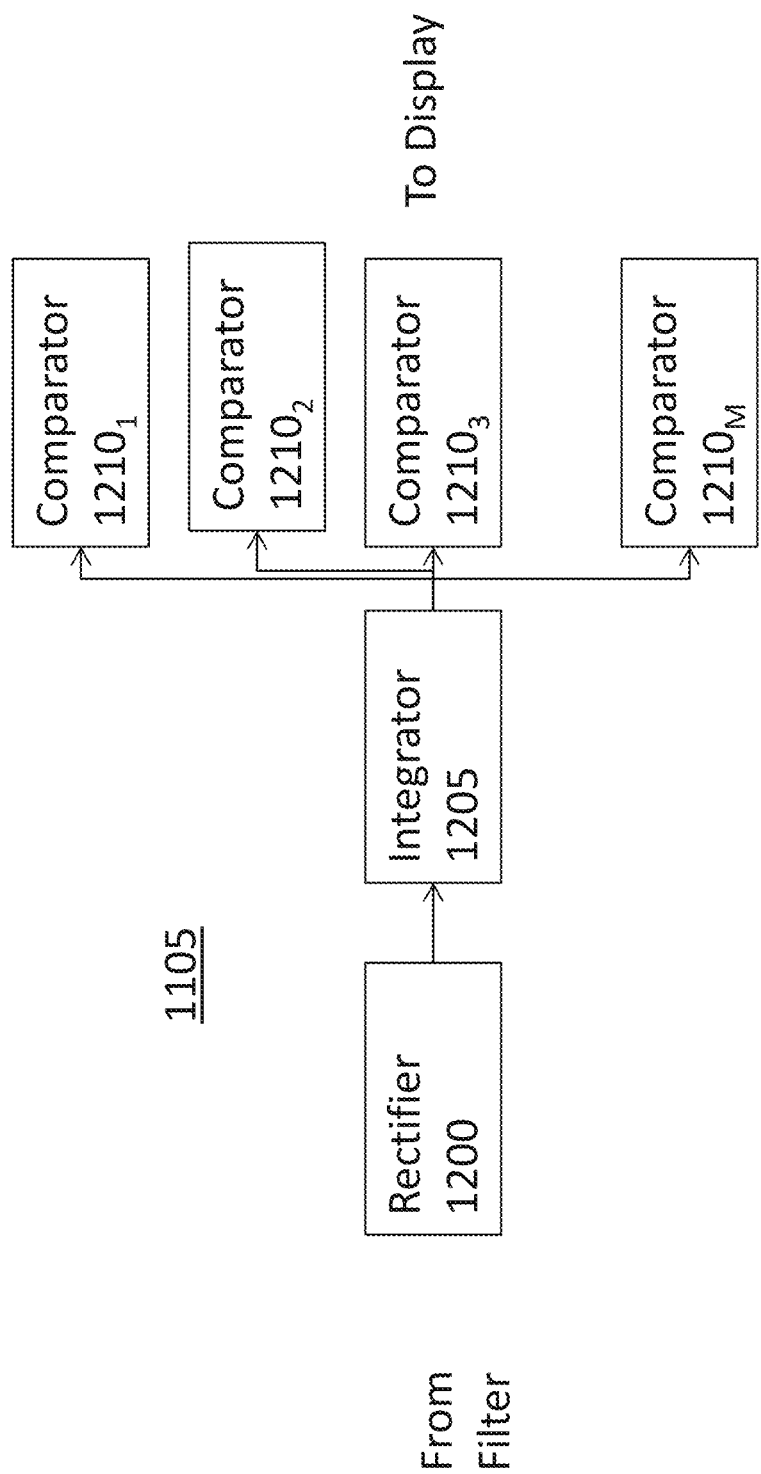
FIG. 12 illustrates a block diagram of a detector of FIG. 11 in accordance with aspects of the disclosure.

The system may have a plurality of detectors 1105$_{1-N}$ (individually referred to as 1105 or by detector number). There is a one-to-one correspondence between detector 1105 and filter 1100. FIG. 12 illustrates a block diagram of an example detector 1105. Each detector 1105 may have the same components and thus only one detector will be described. The detector 1105 may comprise a rectifier 1200, an integrator 1205 and a plurality of comparator 1210$_{1-M}$. The rectifier 1200 is coupled to a corresponding filter 1100. The rectifier 1200 receives the output of the filter. The rectified, filtered signal is supplied to an integrator 1205. The integrator integrates the rectified, filtered signal over a preset time. For example, the time may be 10 ms. In other aspects, the time may be 1 s. The time is not limited to the disclosed examples and other times may be used.

The integrated signal is supplied to one of the input terminals of each comparator 1210 (individually referred to as 1210 or by detector number). The other input terminal of each comparator 1220 is supplied with a reference signal. The reference signal is a threshold. Each threshold is different and represents different amplitude. The lowest threshold may be determined in a manner described above, such as the false alarm rate. For example, the false alarm rate may be defined as a multiple of the noise floor of the measurement. For example, the multiplier may be 6 or more. Each comparator 1210 outputs a signal either zero or one (Low or High). When the amplitude of the integrated signal is larger than a corresponding threshold, the corresponding comparator 1210 output 1 as the detection signal otherwise the detection signal is zero.

Figure 13:
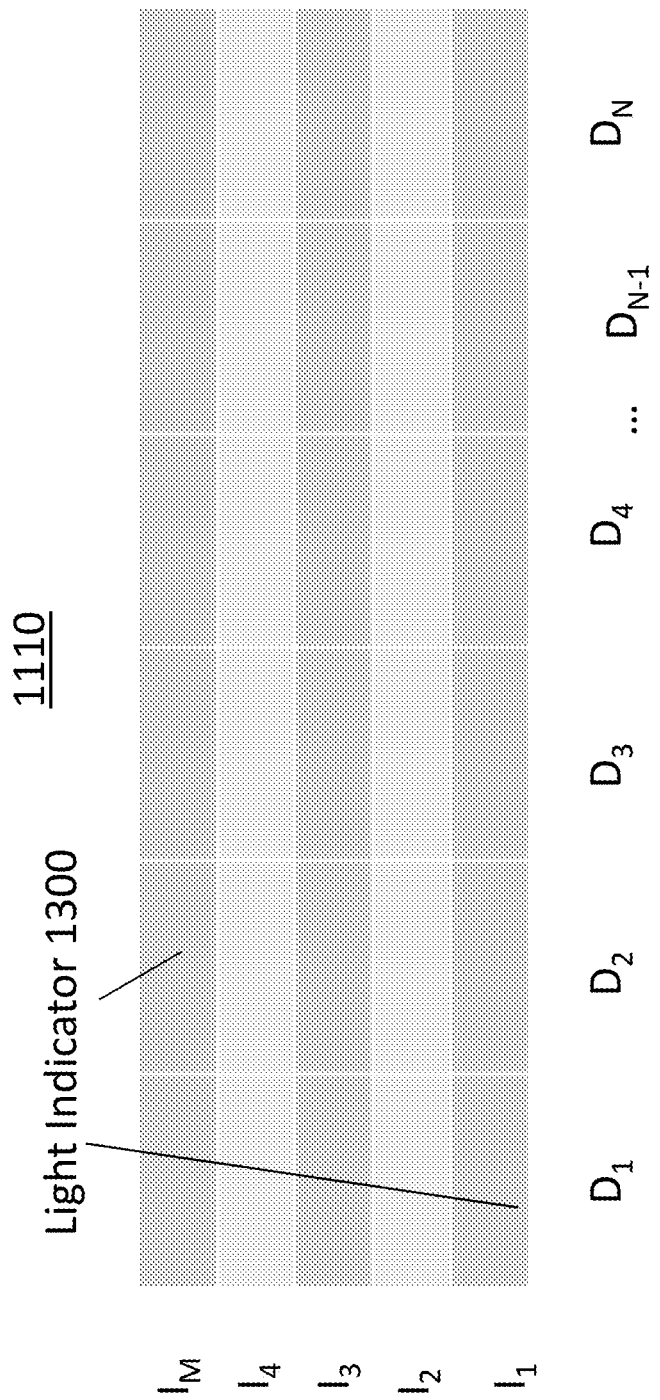
FIG. 13 illustrates a display in accordance with aspect of the disclosure.

The detection signals are supplied to a display 1110. In some aspects of the disclosure, the display 1110 may be a spectrum board. An example of a display 1110 is shown in FIG. 13. The display 1110 may comprises a plurality of light indicators 1300. In FIG. 13 only 2 of the light indicators 1300 are specifically labeled and identified for simplifying the figure and easier view. The light indicators 1300 are arranged in rows and columns. Each columns corresponds to a detector 1105$_{1-N}$ (shown as $D_1$-$D_N$ in FIG. 13), which in turn reflects frequencies, as each detector is tunes to a specific frequency. The rows represent the intensity $I_{1-M}$. The number of rows equals the number of comparators in each detector. The detection signals are coupled to different light indicators. Thus, the greater the intensity of the integrated amplitude, the more indicators emit light. The light indicators 1300 may be LEDs. Thus, the emitted light from the plurality of light indicators 1300 represents the detection signals from the plurality of comparators and from the plurality of detectors 1105$_{1-N}$. The number of rows may be based on an application. For example, if the system is designed to discriminate the type of microbolometer, more rows of indicators (intensity levels) may be needed, e.g., higher resolution.

A person looking at the display 1110 can identify a fundamental frequency based on which indicators are emitting light. For example, the fundamental frequency may be a lowest frequency with a high intensity. In some aspects of the disclosure, the display may be labeled with the corresponding frequency of the tuned filters.

In some aspects, a person looking at the display 1110, after identifying the fundamental frequency, may also identify the harmonics, e.g., integer multiples thereof. An estimated ratio(s) of intensity fundamental frequency and harmonic(s) may be determined from the number of indicators 1300 emitting light for the columns of the fundamental frequency and harmonics. This estimated ratio(s) may be used to determine the type of microbolometer.

Additional filters/detector combinations may be added as more types of microbolometers are classified by its fundamental frequency.

Figure 14:
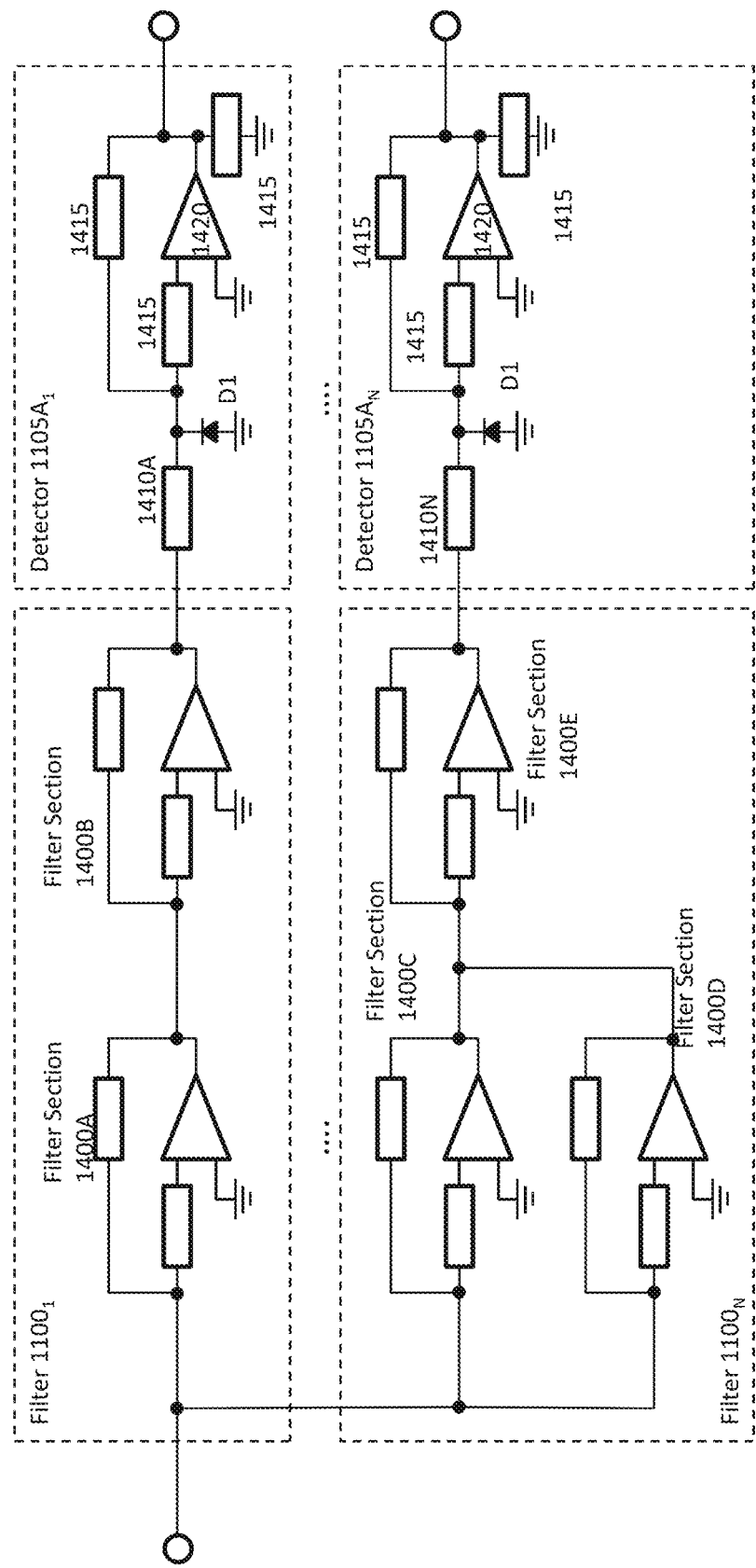
FIG. 14 illustrates a diagram of a filter system and detection system in accordance with other aspects of the disclosure.

In other aspects of the disclosure, the bandpass filters (example of filter 1100$_{1-N}$) may be replaced with a matched filter. FIG. 14 illustrates an example of a matched filter. Each match filter comprises a plurality of filter sections 1405. Each filter sections 1405 comprises an operational amplifier (Op-Amp) and two impedance loads. Each filter section 1405 may act as a second order filter and the impedance loads may be complex. The impedance load may be comprised of combinations of resistors and capacitors. The filters sections 1405 may be cascaded in series and/or parallel and/or a combination thereof. For example, Filter 1 1100$_1$ as depicted as two filter sections 1405A and 1405B in series. Filter N 1100$_N$ has three filter sections 1405C-1405E. Filter sections 1405C-1405D are in parallel, whereas filter sections 1405C and 1405E and 1405D and 1405E are in series. Each filter section 1405 may be designed as a low pass filter, a high pass filter, or a bandpass filter. For example, the filter section 1405A may be a band pass filter and the filter section 1405B may also be a bandpass filter. In other aspects, the filter section 1405A may be a low pass filter and filter section 1405B may be a high pass filter, and vice versa. The combination of the impedance loads determines the frequency response for the filter section.

By setting the impedance loads, each filter section can be tuned such that the matched filter 1100 can discriminate features for a given microbolometer type, including base frequency. For each matched filter 1100, the total number of channels and the relative separation defines filter bandwidth, slope, and rejection requirements such that each fundamental frequency of interest is passed by only a matched filter.

For example, referring to the spectra of FIGS. 5, 6, and 7, a first matched filter 1100$_1$ may be specified at 10 Hz, a second matched filter 1100$_2$ may be specified at 30 Hz and a third matched filter 1100$_3$ may be specified at 60 Hz. In other aspects, the matched filters may be designed for the fundamental frequencies and harmonics.

Detectors 1105A$_{1-N}$ convert filter outputs into lower frequency detection signals. As shown, each detector comprises a rectifier D1 and low pass filter that implements a leaky integrator. The leaky integrator has a time constant defined by its leak rate. The time constant is set by a plurality of impedance blocks 1415 connected to an operational amplifier 1420. The output of the leaky integrator is proportional to output of the rectifier averaged the integrator time constant. The output of each detector is input into a selector 1500.

In an aspect of the disclosure, the overall gain of each individual chain is equivalent to ensure that one chain does not "capture" the selector 1500. As such, each detector 1105 includes an impedance 1410A-N to match the impedance of the respective filter 1100.

Figure 15:
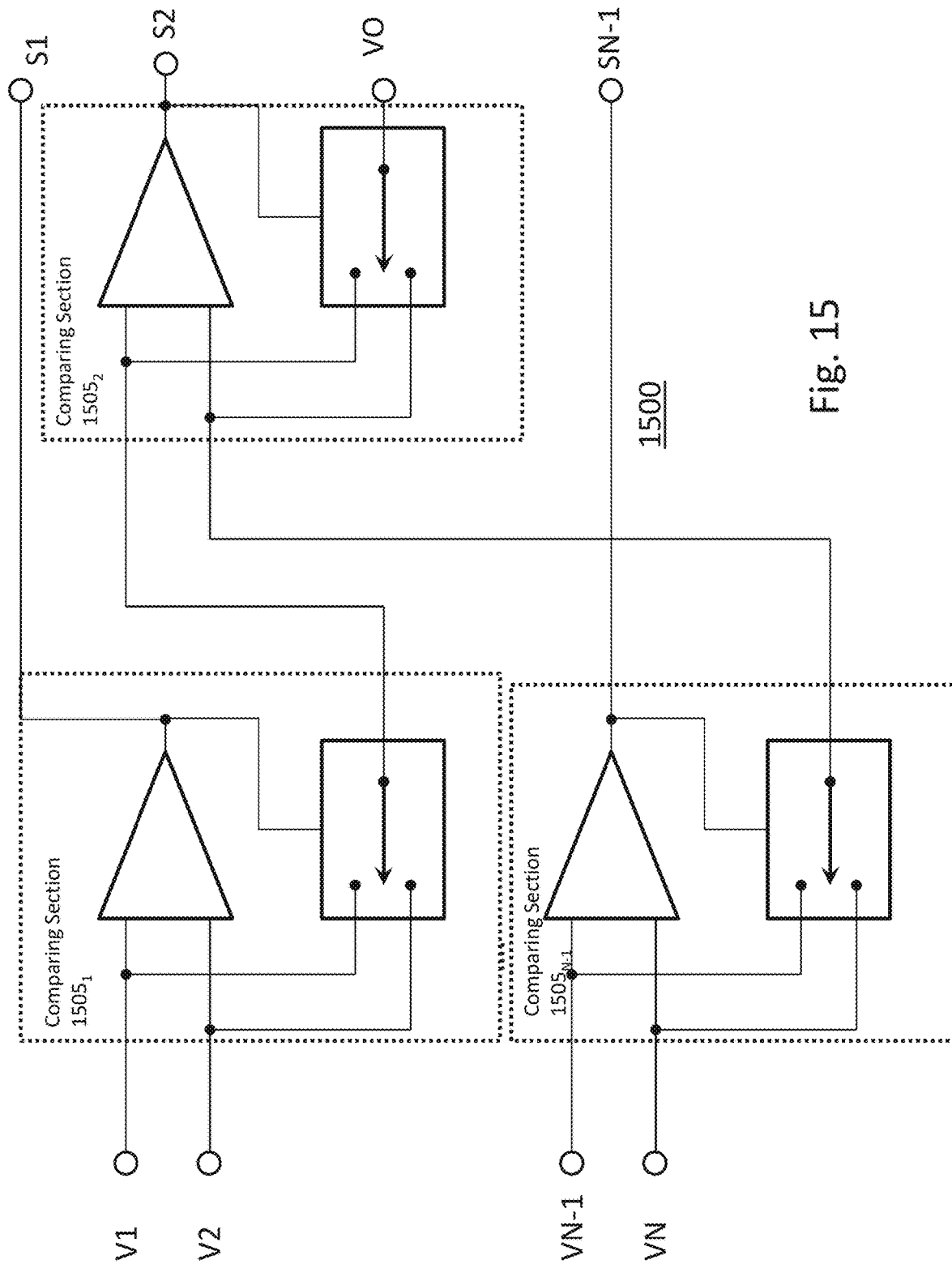
FIG. 15 illustrates a diagram of a selector in accordance with aspects of the disclosure.

FIG. 15 depicts the selector 1500. The selector 1500 comprises a plurality of comparing sections 1505. Each comparing section comprises a comparator and a selection switch. When there are N detectors, there are N−1 comparing sections. For example, the output of the first comparing section $1505_1$ is the larger of the two inputs V1 and V2 (V1 representing the output of detector $1100_1$ and V2 representing the output of detector $1100_2$). A selection signal controls the selecting switch. The selection signal is output from the comparator. The selector 1500 also outputs each selection signals S1, S2 . . . , SN−1.

The selector selects the maximum detection signal output from the plurality of detectors $1105A_{1-N}$. The maximum detection signal represents the type of microbolometer detected. However, in order to know which detector's output was selected, the selection signals are examined. The selection signals are digital levels that encode the states of the three selection switches. From the selection signal, one can determine which input voltage has been routed to the output voltage.

In an aspect of the disclosure, the maximum detection signal and selection signals are supplied to a display 1110. In this expect of the disclosure, the display may be on a mobile terminal. The display may also include a colored light indicator. The colored light indicator emitting a specific color representing the type of microbolometer detected.

In an aspect of the disclosure, the display 1110 depicted in FIG. 13 may be used as the display. For example, each selection signal S1, S2 . . . SN−1 may be connected to a respective column of the display and a light indicator 1300 may emit light depending on the value of the selection signal, e.g., 0 or 1. For example, the light indicator 1330 may emit light when the selection signal is 1. The selected detector V0 may also be connected to a column. The number of indicators emitted light may be based on the value of V0.

Additional matched filters/detector combinations may be added as more types of microbolometers are classified by its fundamental frequency and harmonic (amplitude ratios).

As used herein, the term "processor" may include a single core processor, a multi-core processor, multiple processors located in a single device, or multiple processors in wired or wireless communication with each other and distributed over a network of devices, the Internet, or the cloud. Accordingly, as used herein, functions, features or instructions performed or configured to be performed by a "processor", may include the performance of the functions, features or instructions by a single core processor, may include performance of the functions, features or instructions collectively or collaboratively by multiple cores of a multi-core processor, or may include performance of the functions, features or instructions collectively or collaboratively by multiple processors, where each processor or core is not required to perform every function, feature or instruction individually. For example, a single FPGA may be used or multiple FPGAs may be used to achieve the functions, features or instructions described herein.

Various aspects of the present disclosure may be embodied as a program, software, or computer instructions embodied or stored in a computer or machine usable or readable medium, or a group of media which causes the computer or machine to perform the steps of the method when executed on the computer, processor, and/or machine. A program storage device readable by a machine, e.g., a computer readable medium, tangibly embodying a program of instructions executable by the machine to perform various functionalities and methods described in the present disclosure is also provided, e.g., a computer program product.

The computer readable medium could be a computer readable storage device or a computer readable signal medium. A computer readable storage device, may be, for example, a magnetic, optical, electronic, electromagnetic, infrared, or semiconductor system, apparatus, or device, or any suitable combination of the foregoing; however, the computer readable storage device is not limited to these examples except a computer readable storage device excludes computer readable signal medium. Additional examples of the computer readable storage device can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an optical storage device, or any appropriate combination of the foregoing; however, the computer readable storage device is also not limited to these examples. Any tangible medium that can contain, or store, a program for use by or in connection with an instruction execution system, apparatus, or device could be a computer readable storage device.

A computer readable signal medium may include a propagated data signal with computer readable program code embodied therein, such as, but not limited to, in baseband or as part of a carrier wave. A propagated signal may take any of a plurality of forms, including, but not limited to, electromagnetic, optical, or any suitable combination thereof. A computer readable signal medium may be any computer readable medium (exclusive of computer readable storage device) that can communicate, propagate, or transport a program for use by or in connection with a system, apparatus, or device. Program code embodied on a computer readable signal medium may be transmitted using any appropriate medium, including but not limited to wireless, wired, optical fiber cable, RF, etc., or any suitable combination of the foregoing.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A system for detecting microbolometers comprising:
   a photodiode configured to detect infrared energy in the range of 6-15 µm;
   an analog to digital converter (ADC) having a frequency sampling rate of at least two times an expected frequency range of known microbolometers, the ADC receiving an amplified output from the photodiode and producing a sampled sequence using the frequency sampling rate;
   a processor configured to:
   convert the sampled sequence into a frequency profile;
   examine the frequency profile to identity at least a fundamental frequency;
   determine whether a microbolometer is detected in a line of sight of the photodiode based on the fundamental frequency; and
   issue a detection result.

2. The system of claim 1, further comprising an indicator of the detection result.

3. The system of claim 2, wherein the indicator comprises a light, and wherein light is emitted in a first color when a microbolometer is detected and light is emitted in a second color when a microbolometer is not detected or where light is emitted in a first pattern when a microbolometer is detected and a second pattern when a microbolometer is not detected.

4. The system of claim 1, further comprising a first housing and a second housing, the first housing comprising the photodiode and a lens configured to focus long-wave infrared waves into the photodiode and the second housing comprising the ADC and the processor.

5. The system of claim 4, wherein components in the first housing and components in the second housing are coupled via one or more electric cables.

6. The system of claim 1, wherein the frequency sampling rate of the ADC is at least ten times the expected frequency range, and wherein the processor is configured to examine the frequency profile to identify the fundamental frequency, calculate a ratio of an amplitude at the identified fundamental frequency and an amplitude at a harmonic for one or more harmonic and determine a type of microbolometer when a microbolometer is detected based on one or more ratios.

7. The system of claim 6, further comprising an indicator, wherein the indicator indicates the type of microbolometer.

8. The system of claim 6, further comprising a storage device configured to store types of microbolometers associated with a fundamental frequency, respectively, and an amplitude ratio of an amplitude at fundamental frequency and amplitude at a harmonic, for one or more harmonics.

9. The system of claim 8, wherein the processor determines whether the microbolometer is detected in the line of sight by comparing the identified fundamental frequency in the frequency profile with the stored fundamental frequency for the types of microbolometers and when there is a match, the processor determines that the microbolometer is detected.

10. The system of claim 9, wherein the processor determines the type of the microbolometer by comparing the calculated one or more ratios with the stored one or more ratios associated with the types and when there is a match, the processor identifies the type that matched as the type of microbolometer detected.

11. The system of claim 1, wherein the photodiode is a cryogenic photovoltaic device.

12. The system of claim 11, wherein the cryogenic photovoltaic device is configured to detect long wave infrared waves in a range of 8-12 μm.

13. The system of claim 4, where the first housing is portable.

14. A system comprising:
a long wave infrared camera, the camera comprising a lens and a matrix of detection elements, the matrix comprising a plurality of rows and columns generating image pixels of an image;
analog to digital converters (ADC) having a frequency sampling rate of at least two times an expected frequency range of known microbolometers, each ADC receiving output from the long wave infrared camera for a pixel and producing a sampled sequence using the frequency sampling rate for the pixel;
a processor configured to:
convert the sampled sequence for each pixel into a frequency profile for each pixel;
examine the frequency profile for each pixel to identity at least a fundamental frequency;
determine whether a microbolometer is present within the image based on the fundamental frequency in each pixel; and
issue a detection result.

15. The system of claim 14, wherein the detection result includes the location of the detected microbolometer.

16. The system of claim 15, wherein the detection result is transferred to a host computer in a vehicle and wherein the host computer transforms the location into a vehicle frame or an inertial frame.

17. The system of claim 16, wherein the host computer tracks the detected microbolometer based on successive detection results.

18. The system of claim 17, wherein the vehicle is an unmanned vehicle and the host computer changes a position of the unmanned vehicle based on the tracking.

19. The system of claim 15, further comprising a display, wherein the processor is further configured to cause the image to be displayed on the display having an indication of the detection result superposed on the displayed image.

20. The system of claim 19, wherein the indication is positioned on the pixel in which the microbolometer is detected.

21. The system of claim 15, wherein the frequency sampling rate of the ADC is at least ten times the expected frequency range, and wherein the processor is configured to examine the frequency profile for each pixel to identify the fundamental frequency, calculate a ratio of an amplitude at the identified fundamental frequency and an amplitude at a harmonic for one or more harmonics and determine a type of microbolometer when a microbolometer is detected based on one or more ratios.

22. The system of claim 16, wherein the determined type of microbolometer is superposed on the image as the detection result.

23. A system for detecting microbolometers comprising:
a photodiode configured to detect infrared energy in the range of 6-15 μm;
a plurality of filters coupled to the photodiode;
a plurality of detectors, each detector corresponding to one of the filters; each detector configured to output a plurality of detection signals based on whether an amplitude is greater than different thresholds, and
a display configured to display a representation of the detection signals received from the plurality of detectors.

24. The system of claim 23, wherein the plurality of filters have a central frequency of a known microbolometer, and a bandwidth of +/−1 Hz.

25. The system of claim 23, wherein the display comprises a plurality of columns and rows of light indicators, each of the columns corresponding to one of the plurality of detectors, and each of the rows corresponding to intensity.

26. The system of claim 25, wherein each detector comprises:
a rectifier coupled to a corresponding filter;
an integrator coupled to the rectifier; and
a plurality of comparators coupled to the integrator, each comparator having a different threshold, each comparator outputting one detection signal, where each comparator is coupled to a different light indicator, the different light indicator being in a different row.

27. The system of claim 23, wherein the representation is based on a maximum of the detection signals received from the plurality of detectors.

28. The system of claim 27, wherein the representation indicates a type of microbolometer.

29. A system for detecting microbolometers comprising:
- a photodiode configured to detect infrared energy in the range of 6-15 µm;
- a plurality of matched filters coupled to the photodiode, respectively tuned to at least a fundamental frequency of a known microbolometer;
- a plurality of detectors, each detector corresponding to one of the filters with each detector configured to output a detected signal;
- a selection circuit configured to output a plurality of selection signals, each selection signal being based on a comparison of two different detected signals output from the plurality of detectors; and
- a display configured to display a representation of the plurality of selection signals.

* * * * *